United States Patent

[11] 3,624,408

[72] Inventor Jakob Luscher
Carouge, Geneva, Switzerland

[21] Appl. No. 869,183
[22] Filed Oct. 24, 1969
[45] Patented Nov. 30, 1971
[73] Assignee Societe Suisse Pour L'Industrie Horlogere S.A.
Geneva, Switzerland
[32] Priority Oct. 25, 1968
[33] Switzerland
[31] 15960/68

[54] FREQUENCY DIVIDER
7 Claims, 5 Drawing Figs.

[52] U.S. Cl. .......... 307/220, 307/240, 307/247, 307/251, 307/269, 307/271, 328/16, 328/40
[51] Int. Cl. .......... H03b 19/00
[50] Field of Search .......... 307/220, 225, 240, 247, 251, 269, 271, 304, 295; 328/16, 30, 31, 40; 331/76; 321/60, 65, 70

[56] References Cited
UNITED STATES PATENTS
3,305,730 2/1967 Parzen .......... 307/271 X
3,513,330 5/1970 Berney .......... 307/225
OTHER REFERENCES
Burns et al., Frequency Dividers Including Insulated Gate Transistors, R.C.A. TN No. 623, Mar. 1965. 307/225

*Primary Examiner*—Stanley T. Krawczewicz
*Attorney*—Waters, Roditi, Schwartz & Nissen

ABSTRACT: A frequency divider which comprises an amplifier including an impedance in series with a first MOS transistor controlled by the periodic signal whose frequency is to be divided, a DC voltage source for the supply of the amplifier, a second MOS transistor between the impedance and the first transistor controlled by the amplifier output signal and having a threshold voltage level such that it will open whenever the voltage of the amplifier output signal exceeds a value such that the duration of such excess is substantially equal to the duration of one period of the signal to be divided.

FREQUENCY DIVIDER

This invention relates to frequency dividers.

It is known for electronically operating timepieces, such as clocks and wristwatches, to comprise a time-base-acting quartz oscillator, means for dividing the frequency of the signal produced by the oscillator and an electromechanical converter which is controlled by the signal divided by said means and which serves to drive the time indicating wheel train step by step.

The accuracy of the time indication depends, inter alia, on the stability of the frequency of the quartz oscillator signal, which stability can only be maintained by a particularly effective decoupling action between the oscillator and the dividing stages to which it is connected, as this in particular reduces to a minimum the influence of any changes in the parameters of these stages, whether such changes be due to temperature variations or to ageing of the stage components.

Unfortunately the known decoupling circuits are only able fully to satisfy the above condition at the expense of a relatively large consumption of power. Their use thus becomes problematic if they are to be fitted in electronic timepieces that are supplied by a small cell providing a particularly limited amount of energy, as may for instance be the case with some travel clocks, some pocket watches and particularly with wristwatches.

In particular there has already been proposed in U.S. Pat. No. 3,235,745 a frequency divider consisting of a blocked oscillator, which includes a transistor and an inductivity and is connected to a source of periodic signals, the blocking and unblocking of the oscillator being controlled by the discharging and charging action of a capacitor supplied by said source. Such a divider has a low input impedance so as if connected to the output of a quartz oscillator, it would load this oscillator and create instabilities of the frequency of the signals produced by the quartz oscillator.

In U.S. Pat. No. 2,864,003 there is disclosed a frequency divider formed by a valve oscillator which constitutes the output element of the divider and which includes a resonant circuit whose natural frequency is equal to a submultiple of the frequency of the signal to be divided. In the case of this divider, there can be no effective decoupling action as the input signal, which is to be divided, is fed directly to the grid-anode capacitance of the valve and the anode has a very high varying voltage.

An object of the present invention is to provide a frequency divider so constructed as also to have, in addition to its dividing action, an excellent decoupling action. Such a divider could thus be fed directly by a quartz oscillator with the impulses whose frequency is to be divided, without the stability of the frequency of the oscillator having to suffer from slight changes in the characteristics of the components of the dividing stage under consideration or even of the following stages.

The frequency divider provided by the invention comprises an amplifier including an impedance, a first electronic switch series connected with said impedance, and means for actuating said switch that are controlled by the periodic signal whose frequency is to be divided; a continuous voltage source for the supply of said amplifier; a second electronic switch for controlling said supply, which is disposed between said impedance and said first switch; and means for actuating said second switch which are controlled by the output signal of said amplifier and which are adapted to perform said actuation to close the switch whenever the amplitude of said output signal exceeds a value such that the duration of such excess is substantially equal to the duration of one period of the signal to be divided.

The above divider can to a large extent be made in integrated circuit form.

In a particular constructional form, the impedance is that of a circuit tuned to the frequency of the divided signal so that the above divider may be loaded with a relatively large capacitance while at the same time consuming very little energy. It follows that the coupling of any other dividing stages behind the divider according to the invention is greatly facilitated.

The invention will now be described by way of example with reference to the accompanying drawings wherein.

Figure 1:
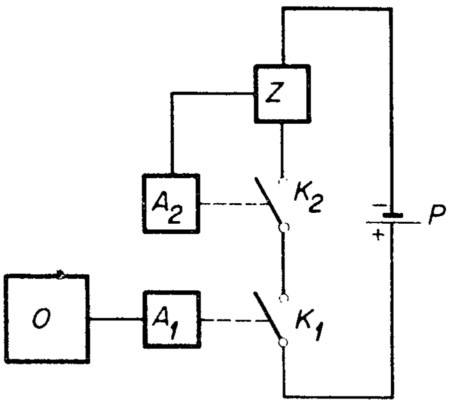
FIG. 1 is a block diagram of a frequency divider coupled to an oscillator whose signal is to be divided.

The frequency divider illustrated in FIG. 1 comprises the following functional elements: Two electronic switches $K_1$ and $K_2$ which are arranged in series with a continuous voltage source P and which serve to control the supply of current to an impedance Z, also connected in series with the source; means $A_1$ for actuating switch $K_1$, which are controlled by the signal produced by an oscillator O at the frequency of this signal; and means $A_2$ for actuating switch $K_2$, which are controlled by the periodic signal that is produced in the impedance Z when current impulses flow therethrough, at the frequency of this periodic signal and for a certain duration.

The design of this divider stems from the following reasoning:

Let it be assumed that the oscillator O produces a sinusoidal signal having a well defined frequency $f_o$ and hence a period $T=(1/f_o)$.

If $n$ periods were cut out from this signal (or from a signal of same frequency directly derived therefrom) every $n+1$ periods, there would thus be obtained another signal whose basic frequency would have the following period:

$$T'=(n+1)\cdot T$$

As described, the electronic switch $K_1$ is controlled by the means $A_1$ at the frequency of the signal produced by the oscillator 0, i.e. it alternately closes and opens at this frequency.

If the electronic switch $K_2$ were permanently closed, switch $K_1$ would produce in the circuit of impedance Z a succession of current impulses in synchronism with the sinusoidal voltage impulses coming from the oscillator 0.

For $n$ periods to be cut out, as indicated above, from this current signal, it suffices, in the FIG. 1 circuit, to keep switch $K_2$ open for $n$ periods and to close it for the duration of about one period.

When flowing through the impedance Z, these current impulses of frequency $f=(1/T')$ will create an alternating voltage having such a frequency.

The arrangement formed by the impedance Z, by the switch $K_1$ and by the means $A_1$ can thus be regarded as constituting an amplifier the operation of which is time-conditioned by the electronic switch $K_2$, the actuation of this switch being synchronized with a submultiple of the signal to be divided.

In the circuit shown in FIG. 1, the control signal for the electronic switch $K_2$ is derived from the voltage across the impedance Z to which is electrically connected the means $A_2$, the function of means $A_2$ being equivalent to that of a time-delayed relay causing the switch to close for a sufficiently short length of time, corresponding substantially to the duration of one period of the control signal.

This duration could also correspond to that of two periods or more of this signal, but it must in any case be less than the duration of one period of the divided signal.

In this latter case, the FIG. 1 circuit would have flowing therethrough current impulse trains having a repetition frequency of $f=(1/T')$.

The illustrated circuit thus constitutes a frequency divider, which should not be confused with known dividers wherein the phase of an oscillator, or of an astable multivibrator of variable frequency, is servo controlled.

In the present case, it is in fact the control signal which brings about the output voltage, at a divided frequency, across the impedance Z, the electronic switch $K_1$, the control means $A_1$ and the impedance Z together form the conditioned amplifier, which is unable to produce an output signal if it is not controlled at the input, as opposed to what happens with conventional servosystems.

It will now be shown how the frequency divider, of which Fig. 1 illustrates the functional diagram, can for instance be made in practice, particularly with a view to being produced to some extent in integrated form.

To this end, the function that is attributed to the electronic switches $K_1$ and $K_2$ and to their associated control means $A_1$ and $A_2$, is fulfilled by two insulated-gate field-effect transistors $T_1$ and $T_2$ that are series connected with source P and with the windings of a transformer $T_r$, the latter being tuned with the capacities of the divider and with those of any subsequent dividing stages which are diagrammatically grouped together in a single rectangle D and which are coupled to the transformer $T_r$. The latter and these various capacitances together constitute the impedance Z, previously mentioned with reference to FIG. 1.

Transistor $T_1$ is connected by its gate to oscillator 0 and is alternately closed and opened at the frequency of the alternating signal produced by this oscillator.

Transistor $T_2$ is connected by its gate to a point *b* lying between two capacitors $C_1$ and $C_2$ forming a capacitive voltage divider connected between the positive pole of source P and the end X of the winding of transformer $T_r$. A second capacitive voltage divider, which is formed by capacitors $C_3$ and $C_4$ and the purpose of which will become apparent later, is connected between the end Y of transformer $T_r$ and the positive terminal of source P.

Figure 2:
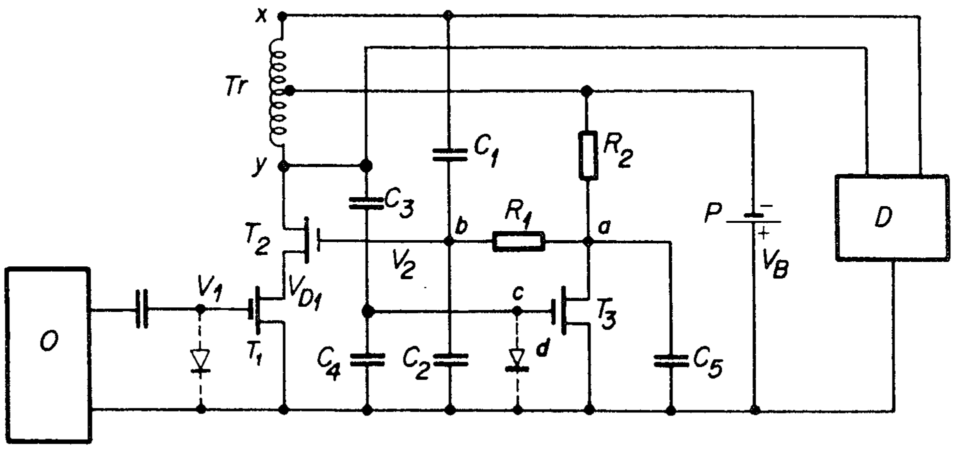
FIG. 2 is the electronic diagram of one possible form of embodiment of such a divider to which is coupled a series of other dividing stages.

The capacitance of capacitors $C_1$, $C_2$, $C_3$ and $C_4$, that of the transistors comprised by the circuit shown in FIG. 2 (to a lesser extent), and that of the dividing stages D constitute the capacitive load of the transformer $T_r$, the latter being tuned with this overall capacitance at the frequency of the divided signal it is desired to obtain.

In the illustrated example, this frequency is chosen six times lower than that of the signal which is produced by oscillator 0 and which controls transistor $T_1$.

Figure 4:
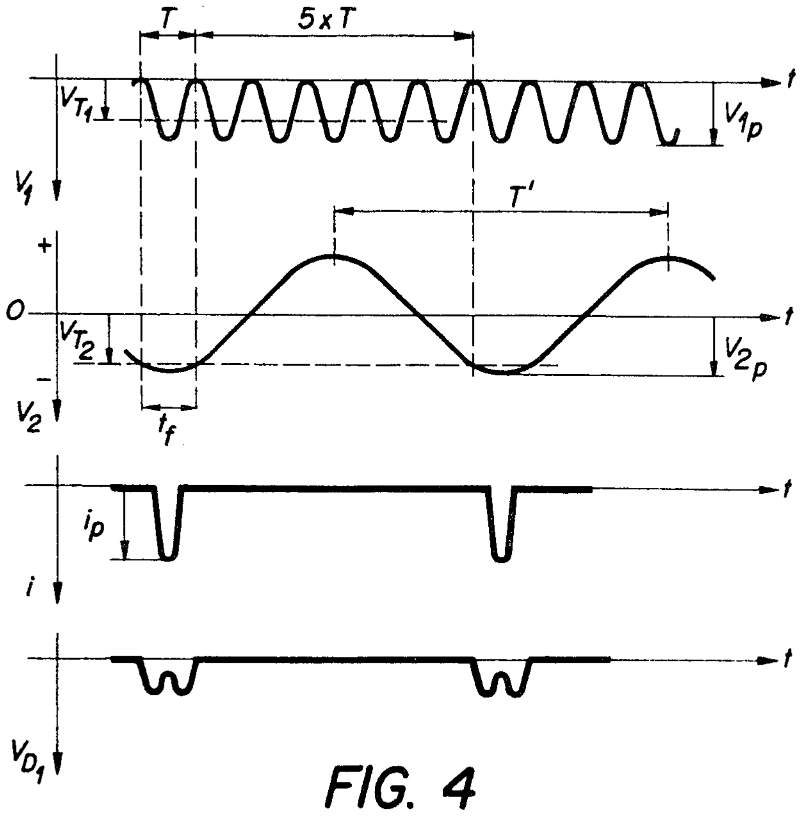

Referring back to the reasoning mentioned in connection with FIG. 1, $n+1$ is thus equal to 6 and $n=5$; this means that transistor $T_2$ will remain blocked for five periods of the signal to be divided, with no current flowing through transistors $T_1$ and $T_2$, whereas during a fraction of the duration of the sixth period, an impulse of current *i* will flow through these transistors (see curves $V_1$ and *i* in FIG. 4).

The throughflow duration of an impulse of current *i* substantially corresponds to the time during which the sinusoidal voltage of the signal from oscillator 0 is greater than the threshold voltage $V_{T_1}$ of transistor $T_1$, if transistor $T_1$ remains open for the duration of one period of the signal from the input voltage source.

If this is the case, the current flowing through the two transistors $T_1$ and $T_2$ has an outline corresponding to that shown in FIG. 4.

The length of time during which transistor $T_2$ is open is obviously equal to the length of time during which the voltage of the signal at the end of the winding, appropriately divided by the capacitive divider $C_1$–$C_2$, exceeds the threshold voltage $V_{T_2}$ of this transistor (see, in the graph of Fig. 4, the curve $V_2$ for the voltage measured at point *b* of FIG. 2).

In the illustrated example, the length of time during which transistor $T_2$ is open, equal to $t_f$, has been chosen to be substantially equal to the duration of one period T of the signal to be divided, produced by the oscillator 0.

Figure 3:
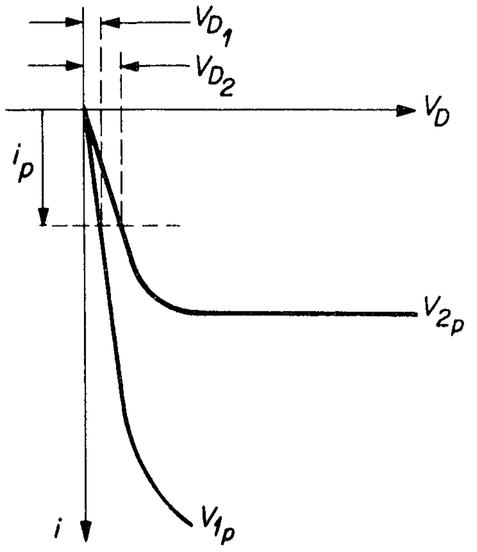
FIGS. 3 and 4 are each a representation of various curves explanatory of the operation of the FIG. 2 divider.

In order that the power losses in the transistors may be particularly low, the latter are intended to operate outside current saturation conditions FIG. 3). This is achieved by so sizing the transistors that their drain voltage $V_D$ will be very low at those instants when the current impulses are passing therethrough.

It is moreover of advantage for the amount by which the control voltage of each transistor exceeds its respective threshold voltage to be greater in the case of transistor $T_1$ than in the case of transistor $T_2$.

From these various precautions, it follows that, on the one hand because of the very short duration of the current impulses flowing through transistors $T_1$ and $T_2$ in relation to the period T' of the divided signal (curve $V_2$ in FIG. 4) and on the other hand because of the very low voltage across the transistors ($V_{D_1}$ and $V_{D_2}$) at that instant, the power losses found to occur in the transistors are really minimal and do not normally exceed 5 percent of the total power consumption: the efficiency of the described frequency divider is thus very high. By using a transformer whose windings are mounted on a body made of ferrite, it is possible to produce the described divider in such a way that the total power consumed may be of the order of 1 to 2 $\mu$W although the signals being divided have a frequency of the order of, for example, 100 kHz.

But the described frequency divider is not limited to the fulfillment of its intrinsic function with only very small power consumption: it enables moreover its output circuit to be effectively decoupled from its input circuit, for the following reasons:

Practically the only element able to produce a coupling action between these two circuits is the capacitance which exists between the drain and the gate of transistor $T_1$ and this is only so for an extremely short length of time, i.e., in the particular selected case in which the described divider is designed to divide a frequency by six, for a length of time corresponding to about one sixth of one period of the output voltage, i.e. the opening time of transistor $T_2$. Moreover, since the drain voltage, $V_{D_1}$, at the output of transistor $T_1$ is at that instant very small and very unresponsive to any variations in the parameters of the output circuit, the input impedance of this transistor consequently only varies to an extremely small extent.

Moreover, because transistor $T_2$ is placed between transistor $T_1$ and impedance Z, there is no direct capacitive connection between the gate of transistor $T_1$ and impedance Z when transistor $T_2$ is blocked, thereby considerably improving the decoupling action between the input and the output of the divider.

Thus a variation of about 10 percent in the output capacitance can thus be made to bring about a variation in the effective capacitance at the input of the circuit of less than 0.001 percent.

The operation of the electronic divider as described with reference to FIGS. 1 to 4 relates to its steady working conditions: such a divider is not self-starting so that it has to be combined with another circuit for starting purposes.

In the example illustrated in FIG. 2, this circuit comprises a capacitive voltage divider formed by capacitors $C_3$ and $C_4$, at the intermediate point of which is connected the insulated gate of a field-effect transistor $T_3$ having its "source" connected to the positive terminal of cell P and having its "drain" connected, firstly, to this same positive terminal via a capacitor $C_5$, secondly, to the negative terminal of cell P, via a resistor $R_2$ and, thirdly, to the point of connection *b* between capacitors $C_1$ and $C_2$, via a resistor $R_1$. A diode *d* is connected between point *c* of the circuit and the positive terminal of cell P. This diode serves to determine the potential at point *c* (clamping).

When the circuit of FIG. 2 is produced in integrated form, except for, of course, the transformer $T_r$, and possible resistors $R_1$ and $R_2$, this diode will consist of a connection of this point to a $p^+$ zone forming a junction with the crystal base of the circuit.

The process for starting the described frequency divider takes place as follows:

At the instant cell P is connected to the illustrated circuit, transistor $T_3$ is blocked and transistor $T_2$ is controlled by the cell voltage via resistors $R_1$ and $R_2$. If oscillator 0 produces its sinusoidal signal at frequency $f_o$ (curve $V_1$ in Fig. 4), transistor $T_1$ is alternately opened and closed by this control voltage at frequency $f_o$ also. Transistor $T_1$ constitutes a resistor in series with transistor $T_2$ which then forms an oscillator with transformer $T_r$ and capacitor $C_1$. When being started the circuit thus operates as an oscillator.

As soon as the amplitude of the output voltage at the ends *x* and *y* of the winding of transformer $T_r$ is sufficiently high, transistor $T_3$ is controlled so that the point *a* of the circuit FIG.

2) is practically grounded. From then on, the circuit no longer operates as an oscillator but as a time-conditioned amplifier, i.e. as a frequency divider.

Figure 5:
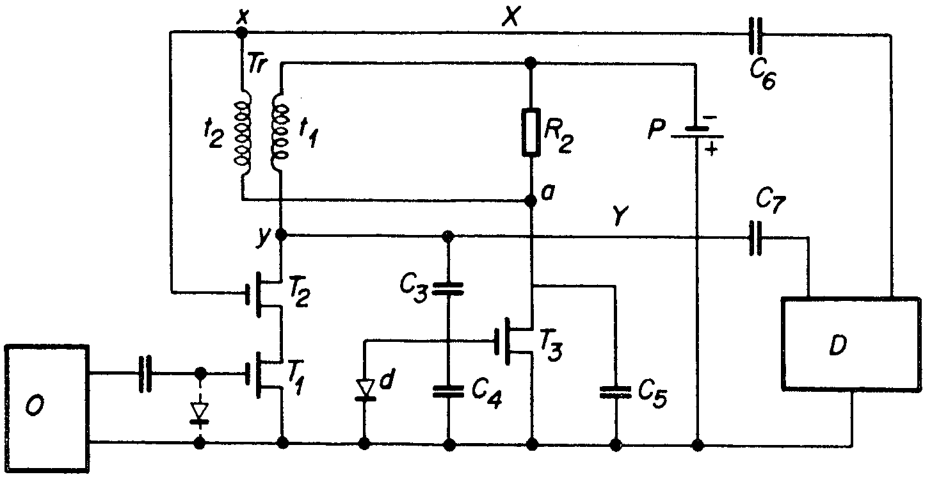
FIG. 5 is the electronic diagram of a variant of the divider shown in FIG. 2.

The variant shown in FIG. 5 differs from the embodiment shown in Fig. 2 mainly in that the transformer $T_r$ is provided with two separate windings $t_1$ and $t_2$, without any galvanic connection therebetween.

The first winding $t_1$ is connected, at one end, to the drain of transistor $T_2$ and, at its opposite end, firstly to the negative terminal of cell P and secondly to one end of resistor $R_2$ which is connected to the drain of transistor $T_3$, as in the FIG. 2 embodiment.

The second winding, $t_2$, of transformer $T_r$ is connected, at one end, to the point of connection $a$ between transistor $T_3$ and resistor $R_2$ and, at its other end, to the gate of transistor $T_2$ which it serves to control.

The signal, of divided frequency, that is produced by the described divider can be picked off at point $x$ of winding $t_2$ and at point $y$ of winding $t_1$, the signals travelling along lines X and Y that are connected to these points being phase-shifted by 180° in relation to one another.

By means of these lines it is possible, as before, to provide a series of dividing stages D with a two-phased supply.

The manner in which this divider operates is similar to that described with reference to FIG. 2. It should however be pointed out that by resorting to a transformer having galvanically independent windings it is possible to reduce the number of components in the circuit, i.e. by doing away with capacitors $C_1$ and $C_2$ and with resistor $R_1$, thereby simplifying the manufacture of this circuit.

The starting of the FIG. 5 divider is just as easy as with the FIG. 2 divider: when cell P is connected to the circuit, transistor $T_3$ is blocked and transistor $T_2$ is controlled by the cell voltage through resistor $R_2$ and the winding $t_2$ of transformer $T_r$. Transistor $T_1$, which is alternately closed and opened by the control voltage supplied thereto by the oscillator 0, acts as a resistor in series with transistor $T_2$, the latter forming an oscillator with transformer $T_r$. At startup, the circuit thus also operates as an oscillator.

As soon as the amplitude of the voltage at points $x$ and $y$ of the windings $t_2$ and $t_1$ of transformer $T_r$ is sufficiently high, the transistor is controlled so that point $a$ of the circuit (FIG. 5) is practically grounded. From then on, the circuit operates no longer as an oscillator but as a frequency divider.

As the described frequency dividers have at their output a tuned circuit, it is then possible to load them capacitively, with the power consumption of their circuits remaining very low.

It is of course possible to have several dividers of this type in a cascade arrangement, so that, in view of the limited amount of power consumed by each of them, it is possible to use quartz crystals oscillating at a high frequency, e.g. at several MHz. Such quartz crystals are of particularly small size and are thus particularly suitable for use in, for instance, a wrist-watch.

In a more simple manner, either of the described frequency dividers can act as a two-phased supply system (phases $x$ and $y$) for a series of dividing stages diagrammatically represented by the rectangle D.

The transistors used in the illustrated arrangements shall with advantage be insulated-gate field-effect transistors of the "enhancement"type: it is known that the current flowing through such resistors is extremely small when their control voltage is nil and this enables dividers of particularly low power consumption to be produced.

In the described circuits, the transistors are of the P-type; these same circuits could of course be made with N-type transistors, in which case only the polarities of the supply cell of each circuit need be reversed.

Although in the preceding description, reference has only been made to use in a watch-piece, clearly a similar divider embodying the inventive concepts that have been set forth, could also be put to use in numerous nonhorological applications.

I claim:

1. A frequency divider which comprises an amplifier including an impedance, a first electronic switch series connected with said impedance, and means for actuating said switch that are controlled by the periodic signal whose frequency is to be divided; a continuous voltage source for the supply of said amplifier; a second electronic switch for controlling said supply, which is disposed between said impedance and said first switch; and means for actuating said second switch which are controlled by the output signal of said amplifier and which are adapted to perform said actuation to close the switch, whenever the amplitude of said output signal exceeds a value such that the duration of such excess is substantially equal to the duration of one period of the signal to be divided.

2. A divider according to claim 1, wherein said first switch and the actuating means associated therewith consist of a first insulated-gate field-effect transistor.

3. A divider according to claim 2, wherein said second switch and the actuating means associated therewith consist of a second insulated-gate field-effect transistor, the insulated gate of said second transistor being controlled by a signal derived from the amplifier output signal.

4. A divider according to claim 3, wherein said impedance comprises a transformer which is connected by at least one of its windings in series with said second transistor and the continuous voltage source, and further comprises the load capacitance of said transformer.

5. A divider according to claim 4, wherein said impedance has a natural frequency substantially equal to the frequency of the desired divided signal.

6. A divider according to claim 1, further comprising an oscillator to ensure starting thereof.

7. A frequency divider comprising an impedance and a first insulated-gate field-effect transistor which are series connected so as to form an amplifier, a continuous voltage source for the electrical supply of the said amplifier, a second insulated-gate field-effect transistor disposed between the said impedance and the said first insulated-gate field-effect transistor, wherein the gate of the said first transistor is to be controlled by the periodic signal whose frequency is to be divided and the gate of the said second transistor is connected, through a first control circuit, to the output of the divider and, through a second control circuit, to a first terminal of the said continuous voltage source, the said second circuit comprising a series arrangement of two electrical resistance members, a third insulated-gate field-effect transistor disposed between the connecting point of the said members and the second terminal of the said continuous voltage source and whose insulated-gate is connected, through a third control circuit, to the output of the divider so as to be controlled by a signal derived from the divided signal appearing at the said output, the threshold voltage of the said second insulated-gate field-effect transistor and the threshold voltage of the third insulated-gate field-effect transistor having a such value that the said second and third transistors become conductive when the amplitude of the output signal of the divider exceeds a value such that the duration of such excess is substantially equal to the duration of one period of the signal to be divided, whereby the gate of the said second transistor is controlled either by the said continuous voltage source, through the said second control circuit, as long as the said third transistor is blocked, or by a signal derived from the output signal of the divider, through the said first control circuit, when the said third transistor is conductive.

* * * * *